(12) United States Patent
Ma et al.

(10) Patent No.: US 7,863,193 B2
(45) Date of Patent: Jan. 4, 2011

(54) INTEGRATED CIRCUIT FABRICATION PROCESS USING A COMPRESSION CAP LAYER IN FORMING A SILICIDE WITH MINIMAL POST-LASER ANNEALING DOPANT DEACTIVATION

(75) Inventors: Yi Ma, Santa Clara, CA (US); Philip Allan Kraus, San Jose, CA (US); Christopher Sean Olsen, Fremont, CA (US); Khaled Z. Ahmed, Anaheim, CA (US); Abhilash J. Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 559 days.

(21) Appl. No.: 11/836,326

(22) Filed: Aug. 9, 2007

(65) Prior Publication Data

US 2009/0042354 A1    Feb. 12, 2009

(51) Int. Cl.
    H01L 21/44 (2006.01)
(52) U.S. Cl. .................. 438/683; 438/533; 438/637; 438/672; 438/E21.002
(58) Field of Classification Search .......... 438/308, 438/378, 473, 795, 612–624, 637–638, 672–673, 438/700, 553, 662–664
    See application file for complete search history.

(56) References Cited

U.S. PATENT DOCUMENTS

| | | | |
|---|---|---|---|
| 6,410,430 B1 | 6/2002 | Lee et al. | 438/664 |
| 6,475,888 B1 | 11/2002 | Sohn | 438/535 |
| 6,555,453 B1 | 4/2003 | Xiang et al. | 438/581 |
| 6,653,227 B1 | 11/2003 | Lai et al. | 438/633 |
| 6,987,283 B2 | 1/2006 | Zhang et al. | 257/59 |
| 7,214,630 B1 | 5/2007 | Veradararajan et al. | 438/778 |
| 2003/0196996 A1 | 10/2003 | Jennings et al. | 219/121.73 |
| 2004/0183136 A1 | 9/2004 | Williams et al. | 257/369 |
| 2005/0170611 A1 | 8/2005 | Ghyselen et al. | 438/458 |
| 2006/0022270 A1 | 2/2006 | Boyd et al. | 257/351 |
| 2006/0289918 A1 | 12/2006 | McDaniel et al. | 257/296 |
| 2007/0020821 A1 | 1/2007 | Toyoda | 438/149 |
| 2007/0032095 A1 | 2/2007 | Ramaswamy et al. | 438/795 |
| 2007/0102706 A1 | 5/2007 | Choi et al. | 257/72 |
| 2008/0076238 A1 | 3/2008 | Miyashita et al. | 438/527 |
| 2009/0042376 A1* | 2/2009 | Ma et al. | 438/524 |

OTHER PUBLICATIONS

U.S. Appl. No. 11/836,267, filed Aug. 9, 2007, Ma et al.

(Continued)

*Primary Examiner*—Dung A. Le
(74) *Attorney, Agent, or Firm*—Law Office of Robert M. Wallace

(57) ABSTRACT

Post-laser annealing dopant deactivation is minimized by performing certain silicide formation process steps prior to laser annealing. A base metal layer is deposited on the source-drain regions and the gate electrode, followed by deposition of an overlying compression cap layer, to prevent metal agglomeration at the silicon melting temperature. Thereafter, a rapid thermal process is performed to heat the substrate sufficiently to form metal silicide contacts at the top surfaces of the source-drain regions and of the gate electrode. The method further includes removing the remainder of the metal-containing layer and then depositing an optical absorber layer over the substrate prior to laser annealing near the silicon melting temperature.

24 Claims, 14 Drawing Sheets

OTHER PUBLICATIONS

U.S. Appl. No. 11/836,299, filed Aug. 9, 2007, Ma et al.
Official Action Dated Jan. 29, 2010 Issued in Co-Pending U.S. Appl. No. 11/836,267.
Official Action Dated Oct. 29, 2009 Issued in Co-Pending U.S. Appl. No. 11/836,267.

* cited by examiner

INTEGRATED CIRCUIT FABRICATION PROCESS USING A COMPRESSION CAP LAYER IN FORMING A SILICIDE WITH MINIMAL POST-LASER ANNEALING DOPANT DEACTIVATION

BACKGROUND

As integrated circuit technology has advanced toward smaller device sizes, the industry has searched for ways of annealing ion implanted dopant impurities that minimize diffusion of the impurities. Such diffusion can distort (deepen) shallow junction implanted regions as a function of the time and temperature over which the implanted dopants are annealed. The annealing process repairs damage to the semiconductor crystal arising during ion implantation and activates the implanted semiconductor junctions by moving the implanted dopant atoms from interstitial sites to substitutional sites in the semiconductor crystal lattice. Conventional annealing methods have typically employed radiant lamps that heat the wafer to a sufficiently high temperature to achieve the desired effect. One such method holds the wafer at an elevated temperature for a relatively long (one to sixty second) period and produces a relatively large amount of implanted dopant diffusion. For smaller device sizes (e.g., 45 nm), a faster annealing process is desired, such as a spike anneal in which the wafer temperature is ramped up to an elevated temperature and then returned to its former temperature within half a second. An even faster process that can be suitable for device sizes at or below 45 nm is flash annealing, in which the wafer temperature is raised from 400° C. to 1100° C. and then returned to 400° C. within milliseconds. While flash annealing can achieve favorable results at 45 nm, it entails a higher risk of wafer breakage because of the sudden wafer temperature excursion. The need for a reliable post-implant annealing process that will work at the lowest device sizes that the industry is now contemplating (below 45 nm, e.g., 30 nm and 15 nm) has been recently met by the dynamic surface annealing (DSA) process. This process scans a powerful micron-thin line of monochromatic laser light across the wafer at a rate such that, at any instant, only a thin shallow region of the wafer is heated to near melting (e.g., 1300° C.) for an extremely short period of time (e.g., 100 μsec), this time being kept short because the entire remainder of the wafer serves as a heat sink for the heated zone. The result is little or no diffusion of the implanted dopant atoms, enabling realization of ultra-shallow implanted junction depths, and much less risk of wafer breakage. The DSA process is disclosed in U.S. Patent application publication No. US 2003/0196996, the entire disclosure of which is incorporated herein by reference.

Typically, the DSA process is carried out immediately after ion implantation of the dopant atoms in the semiconductor crystal. The DSA annealing step may be preceded by a short but lower temperature (e.g., 800° C.) annealing step using radiant lamps to repair ion implantation damage to the crystal. Typically, during the entire DSA step, an optical absorption layer such as amorphous carbon covers the wafer surface to provide uniform process results, the optical absorber layer being removed upon completion of the DSA step with a low temperature oxygen ashing.

Upon removal of the optical absorber layer, subsequent low temperature process steps that must be carried out require raising the wafer temperature above 400° C. for relatively long time frames, so that some of the implanted dopant atoms which were placed in substitutional crystalline sites return to interstitial sites, thereby deactivating a significant fraction of the dopants in the ion implanted regions (i.e., the source, drain and gate regions). These low temperature process steps include the formation of metal-silicide contacts on the top surfaces of the implanted regions, entailing deposition of a suitable metal followed by a rapid thermal process (RTP) step above 400° C. (e.g., about 450° C.) to form the metal-silicide material. Other low temperature process steps include deposition of an etch stop ($Si_3N_4$) layer and the deposition of a thick (e.g., 5000 Å) pre-metal dielectric (PMD) layer (typically $SiO_2$) over the etch stop layer. The formation of the PMD layer can involve heating the wafer to 600° C. to 800° C. for minutes or hours.

The problems discussed above, including the dopant deactivation by subsequent low temperature processing steps, and variation in device characteristics by oxidation of the gate stack and adjacent silicon surfaces during the removal of the amorphous carbon optical absorber layer, are more critical in devices of smaller sizes (below 45 nm), and these problems must be solved in order enable fabrication of devices smaller than 45 nm.

SUMMARY

A method is provided for processing a substrate having a silicon-containing semiconductor channel and an overlying silicon-containing gate electrode separated from the channel by a thin gate dielectric layer and ion implanted source and drain regions. The method includes depositing a base metal layer of nickel on the top surface of the substrate so as to contact the ion implanted source-drain regions and the gate electrode. The method further includes depositing on the base metal layer an overlying compression cap layer on the base metal layer. In one embodiment, the compression cap layer is deposited to a sufficient thickness to prevent agglomeration of metal silicide material at or near the melting temperature of the silicon during a later exposure to laser radiation. Thereafter, a rapid thermal process is performed to heat the substrate sufficiently to form metal silicide contacts at the top surfaces of the source-drain regions and of the gate electrode. The method further includes removing the remainder of the metal-containing layer and then depositing an optical absorber layer over the substrate. A focused line beam of radiation from an array of plural lasers is scanned across the substrate along a direction transverse to the focused line beam so as to create a surface temperature near the melting point of the substrate in a surface zone illuminated by the line beam. Thereafter, the optical absorber layer is removed.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Figure 1:
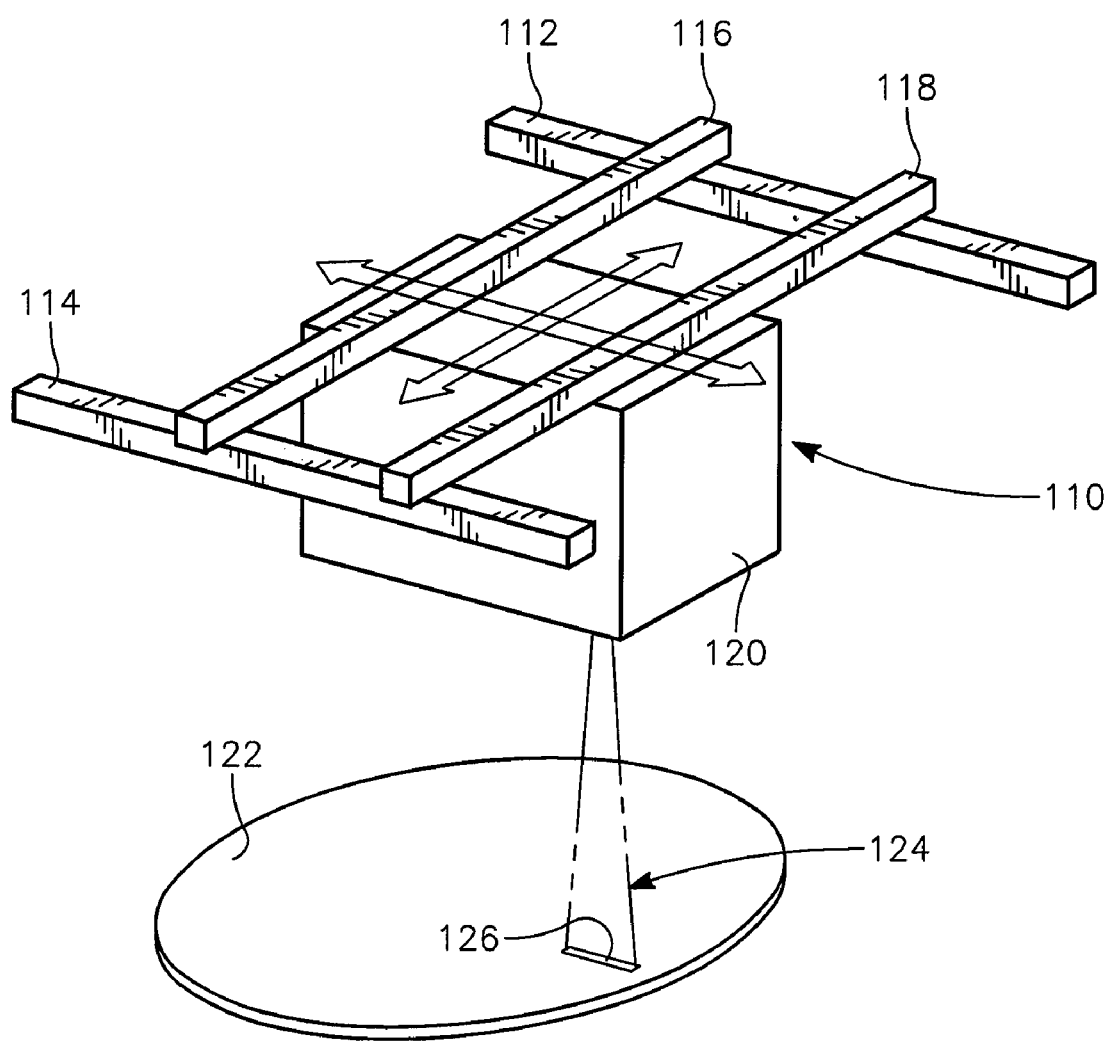
FIG. 1 is a simplified diagram of dynamic surface annealing apparatus.
Figure 2:
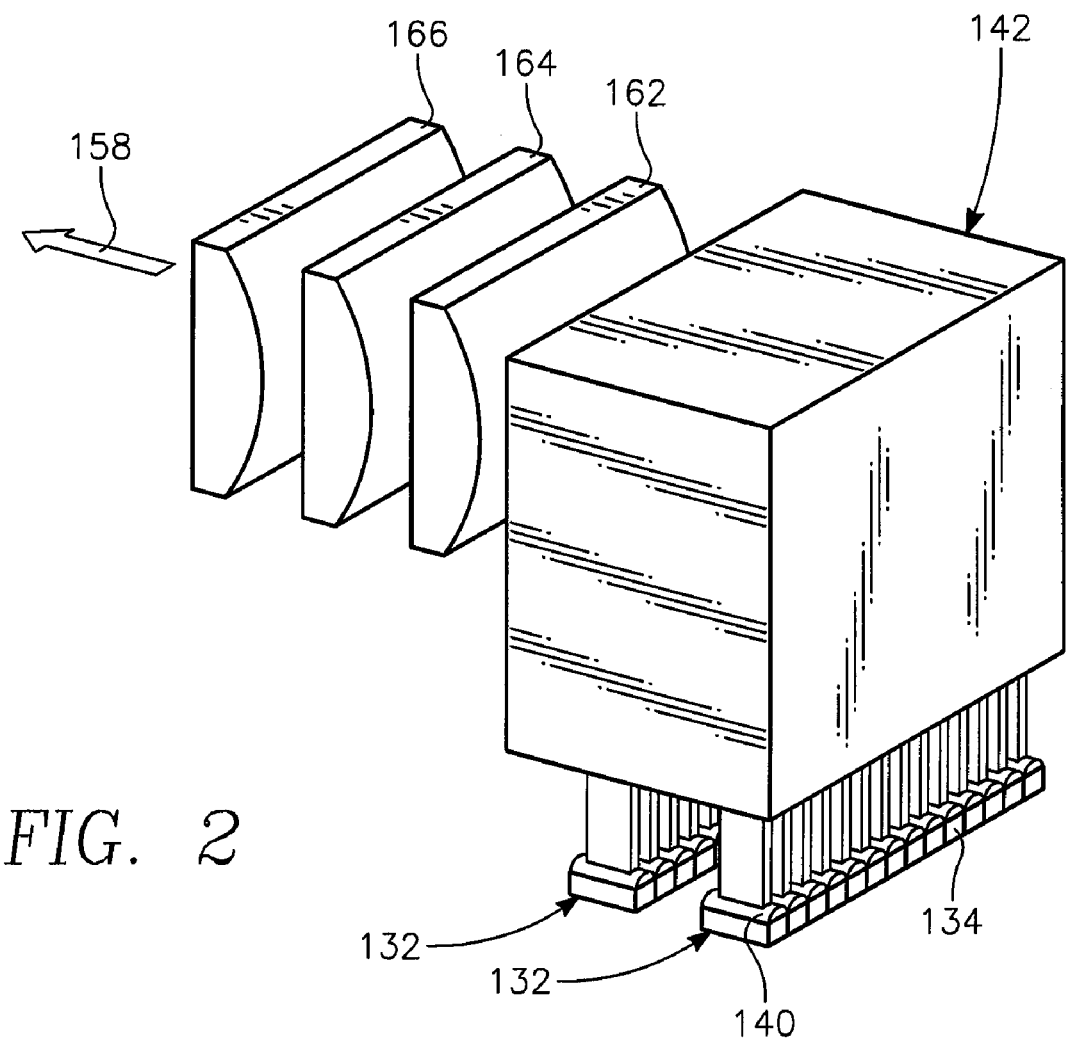
FIG. 2 is a simplified diagram of certain optical components in the apparatus of FIG. 1.
Figure 3:
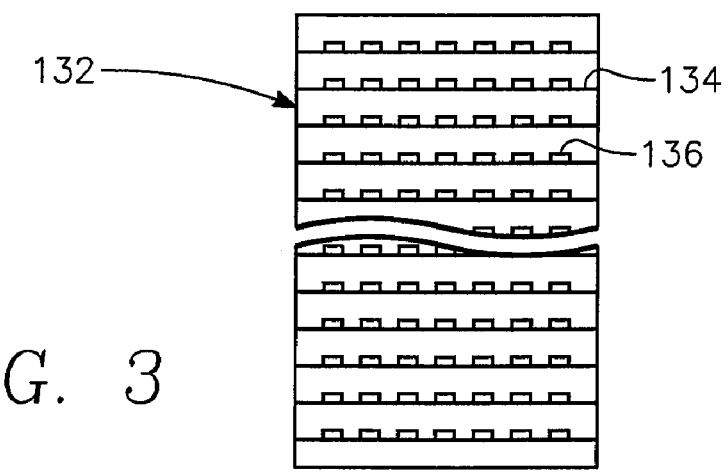
FIG. 3 is a simplified view of a laser array in the apparatus of FIG. 1.

The DSA Process:

The DSA process will first be described with reference to the drawings of FIGS. 1-3. The dynamic surface anneal (DSA) step uses a large array of CW 810 nm diode lasers to produce a single intense beam of light that is projected on the wafer surface as a thin long line of radiation. The line is then scanned over the surface of the wafer in a direction perpendicular to the long dimension of the line beam. One embodiment of the light source is illustrated in the schematic orthographic representation of FIG. 1. A gantry structure 110 for two-dimensional scanning includes a pair of fixed parallel rails 112, 114. Two parallel gantry beams 116, 118 are fixed together a set distance apart and supported on the fixed rails 112, 114 and are controlled by an unillustrated motor and drive mechanism to slide on rollers, source, or ball bearings together along the fixed rails 112, 114. A beam source 120 is slidably supported on the gantry beams 116, 118, e.g. suspended below the beams 116, 118 and is controlled by unillustrated motors and drive mechanisms to slide along them. A silicon wafer 122 or other substrate is stationarily supported below the gantry structure 110. The beam source 120 includes laser light source and optics to produce a downwardly directed fan-shaped beam 124 that strikes the wafer 122 as a line beam 126 extending generally parallel to the fixed rails 112, 114, in what is conveniently called the slow direction. Although not illustrated here, the gantry structure further includes a Z-axis stage for moving the laser light source and optics in a direction generally parallel to the fan-shaped beam 124 to thereby controllably vary the distance between the beam source 120 and the wafer 122 and thus control the focusing of the line beam 126 on the wafer 122. Exemplary dimensions of the line beam 126 include a length of 1 cm and a width of 100 microns with an exemplary power density of 400 kW/cm$^2$. Alternatively, the beam source and associated optics may be stationary while the wafer is supported on a stage which scans it in two dimensions.

In typical operation, the gantry beams 116, 118 are set at a particular position along the fixed rails 112, 114 and the beam source 120 is moved at a uniform speed along the gantry beams 116, 118 to scan the line beam 126 perpendicularly relative to its long dimension in a direction conveniently called the fast direction. The line beam 126 is thereby scanned from one side of the wafer 122 to the other to irradiate a 1 cm swath of the wafer 122. The line beam 126 is narrow enough and the scanning speed in the fast direction fast enough that a particular area of the wafer is only momentarily exposed to the optical radiation of the line beam 126 but the intensity at the peak of the line beam is enough to heat the surface region to very high temperatures. However, the deeper portions of the wafer 122 are not significantly heated and further act as a heat sink to quickly cool the surface region. Once the fast scan has been completed, the gantry beams 116, 118 are moved along the fixed rails 112, 114 to a new position such that the line beam 126 is moved along its long dimension extending along the slow axis. The fast scanning is then performed to irradiate a neighboring swath of the wafer 122. The alternating fast and slow scanning are repeated, perhaps in a serpentine path of the beam source 120, until the entire wafer 122 has been thermally processed. One example of optics beam source 120, illustrated in FIG. 2, receives laser radiation at about 810 nm from two laser bar stacks 132, one of which is illustrated in end plan view in FIG. 3. Each laser bar stack 132 includes 14 parallel bars 134, generally corresponding to a vertical p-n junction in a GaAs semiconductor structure, extending laterally about 1 cm and separated by about 0.9 mm. Typically, water cooling layers are disposed between the bars 134. In each bar 134 are formed plural (e.g., forty-nine) emitters 136, each constituting a separate GaAs laser emitting respective beams having different divergence angles in orthogonal directions. The illustrated bars 134 are positioned with their long dimension extending over multiple emitters 136 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIG. 2, cylindrical lenslets 140 are positioned along the laser bars 134 to collimate the laser light in a narrow beam along the fast axis. They may be bonded with adhesive on the laser stacks 132 and aligned with the bars 134 to extend over the emitting areas 136. The two sets of beams from the two bar stacks 132 are input to conventional optics 142. The source beam 158 is then passed through a set of cylindrical lenses 162, 164, 166 to focus the source beam 158 along the slow axis.

Figure 4A:
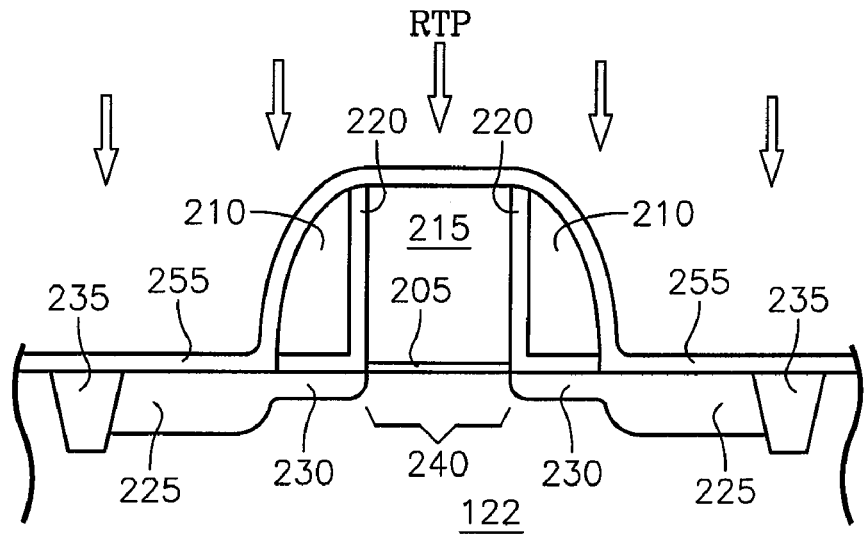
FIGS. 4A through 4E are successive images of a workpiece or wafer corresponding to steps in a process in an embodiment.

Integrated Processes with Minimal Dopant Deactivation:

One embodiment of an integrated process, including the DSA step, that prevents or minimizes dopant deactivation is described with reference to FIGS. 4A-4E and FIG. 5. In this process, at least some of the low temperature processes that have typically been performed after the DSA step are performed before the DSA step. This precludes the potential deactivation of dopants by the low temperature process steps. FIG. 4A is a cross-sectional side view of a portion of a partially fabricated integrated circuit after ion implantation but before post-implant annealing. The integrated circuit of FIG. 4A includes a crystalline silicon substrate 122, a thin gate silicon dioxide layer 205, a silicon nitride spacer 210 and a polycrystalline silicon gate 215 overlying the thin gate oxide layer 205. The spacer 210 may be separated from the polycrystalline silicon gate 215 and from the silicon substrate 122 by a thin silicon dioxide liner 220. Source-drain regions 225 and source-drain extensions 230 have been formed by ion implantation of a dopant impurity, such as boron or arsenic. Specifically, dopants are ion implanted throughout the areas both the source-drain regions 225 and source-drain extensions 230 to an ultra-shallow junction depth. Then, the spacers 210 and liners 220 are formed. Thereafter, a dopants are ion implanted to a much greater junction depth in the areas of the source-drain regions 225 only (the extensions 230 being masked by the spacers 210). Shallow isolation trenches 235 filled with an insulator material such as silicon dioxide provide outer boundaries for the source-drain regions 225. The source-drain regions are implanted to a shallow depth (e.g., 500-700 Å) and the source-drain extensions 230 are implanted to an ultra-shallow depth (e.g., 250 Å). The channel 240 defined between the two source-drain extensions 230 may be on the order of about 45 nm.

We have performed annealing of the implanted regions, including rapid thermal process (RTP) and DSA, prior to contact (e.g., nickel silicide) formation in the surfaces of the source-drain regions 225 and the gate 215. This approach postpones certain low temperature process steps until after the post-implant annealing (the DSA step), which can lead to dopant deactivation in the source-drain regions and extensions 225, 230 during the later low temperature process steps. Such low temperature process steps include the heating of the wafer following nickel layer deposition to form the nickel silicide contacts. Other low temperature process steps include the deposition of an etch stop layer and the deposition of the thick (5000 Å) pre-metal dielectric (PMD) layer. In one embodiment, the DSA process step is performed after at least some of these low temperature process steps in order to avoid or reduce dopant deactivation that would otherwise occur during performance of such low temperature process steps. In one embodiment of the process sequence depicted in FIGS. 4A through 4E, the DSA process step is performed after formation of the nickel silicide contacts. In another embodiment, the DSA process step is performed after nickel silicide contact formation and after deposition of the etch stop layer. This avoids or reduces dopant deactivation. Instead, the etch stop layer protects the substrate surface from oxidation during post-DSA removal of the optical absorber or amorphous carbon layer (ACL).

Figure 4B:
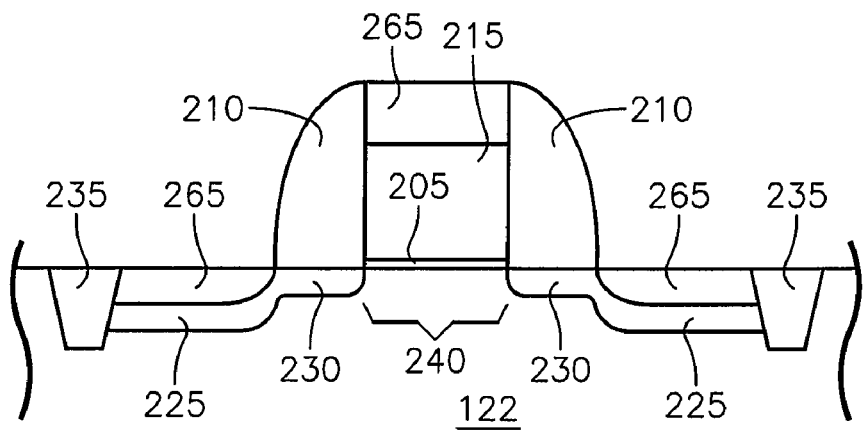

The process sequence illustrated in FIGS. 4A through 4E will now be described with reference to the process flow diagram of FIG. 5. The first step (block 250 of FIG. 5) is to deposit a metal layer 255 shown in FIG. 4A over the entire substrate. The metal layer 255 may be nickel, and touches silicon only on the surfaces of the source-drain regions 225 and on the surface of the gate 215. This step may be carried out in a plasma enhanced physical vapor deposition (PEPVD) plasma reactor, in which a metal (e.g., nickel) target is sputtered to produce the nickel deposition material that forms the layer 255. In the next step (block 260 of FIG. 5), a rapid thermal process (RTP) step is performed to raise the temperature of the wafer 122 to about 450° C. so that some of the nickel layer 255 reacts with the silicon in the top surfaces of the source-drain regions 225 and the gate 215 to form nickel silicide contacts 265 depicted in FIG. 4B. The nickel material from the layer 255 reacts substantially only with the silicon material of the exposed source-drain regions 225 and with polycrystalline silicon material of the top surface of the gate 215. The remaining surfaces of the substrate 122 contacted by the nickel layer 255 are either silicon dioxide or silicon nitride materials, which essentially do not react with the nickel material of the layer 255. Therefore, the RTP step 260 forms nickel silicide in the surfaces of the source-drain regions 225 and gate 215 to form nickel silicide contacts 265 depicted in FIG. 4B. The nickel layer 255 is sufficiently thick so that not all of the nickel in the layer 255 is consumed in this silicide-forming reaction, thereby leaving a portion of the layer 255 unused. In the view of FIG. 4B, the excess nickel (i.e., the remaining portion of the layer 255 that has not been consumed to form nickel silicide) has been stripped off in a wet clean step (block 270 of FIG. 5).

In the foregoing embodiment, the nickel-silicide formation including the RTP step 260 is completed prior to performance of a dynamic surface annealing or dopant activation step. This prevents post-DSA deactivation of the implanted dopant atoms by the nickel silicide formation including the RTP step 260.

Figure 4C:
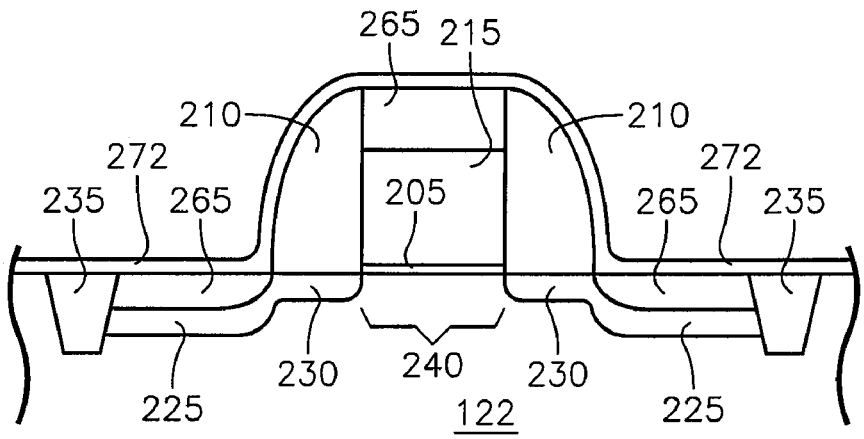
Figure 4D:
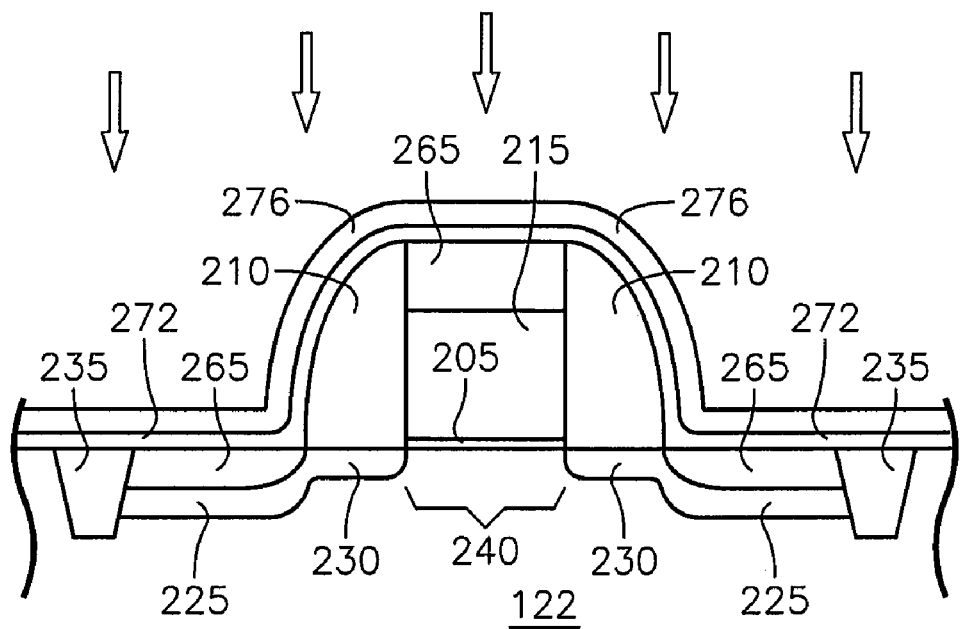
Figure 4E:
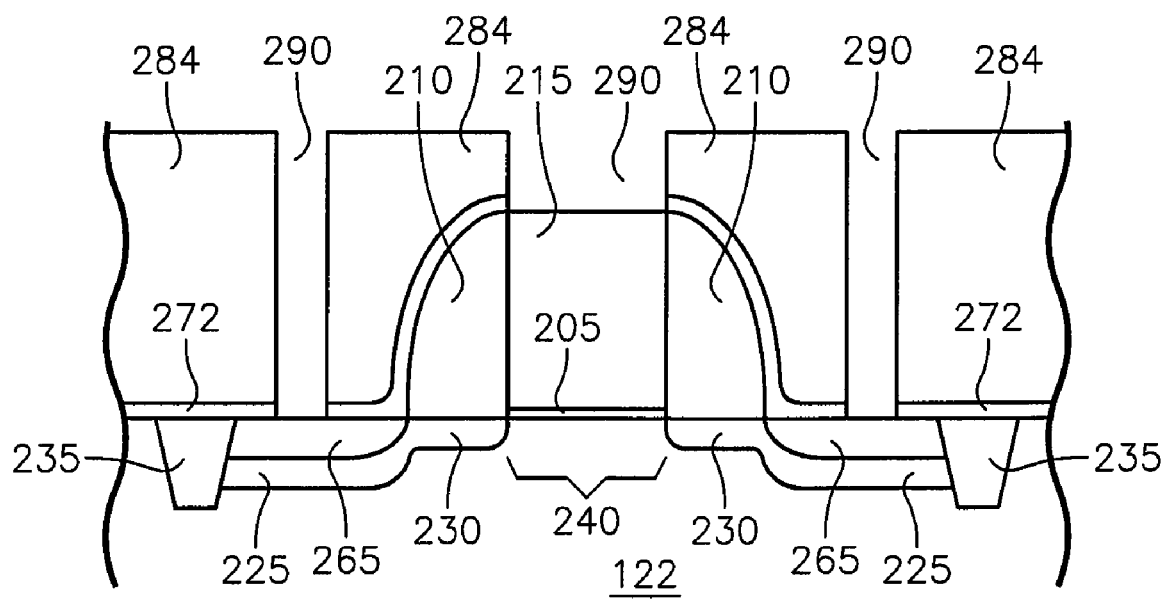

In a further embodiment, the etch step layer deposition step is also performed prior to the DSA step. This further embodiment is also depicted in FIGS. 4A through 4E and FIG. 5. In this further embodiment, after completion of the wet clean step (block 270 of FIG. 5, an etch stop layer (e.g., a silicon nitride layer) 272 shown in FIG. 4C is deposited (in the step of block 274 of FIG. 5) to a thickness of, for example, about 1000 Å. At this point, the wafer is prepared for the DSA process step by depositing an optical absorber layer 276 shown in FIG. 4D (in the step of block 278 of FIG. 5) directly onto the etch stop layer 272. The optical absorber layer 276 may be an amorphous carbon layer (ACL) on the order of about 8000 Å thick. Deposition of the ACL 276 may be carried out in a high density plasma chemical vapor deposition (HDPCVD) reactor or in a plasma enhanced physical vapor deposition (PECVD) reactor. Then, the DSA step (block 280 of FIG. 5) is performed in the manner described in FIGS. 1-3, for example. The ACL optical absorber layer 276 is removed (block 282 of FIG. 5) in an oxygen plasma. After removal of the ACL 276, a 3000 Å to 5000 Å thick pre-metal dielectric (PMD) layer 284 (e.g., of silicon dioxide material) is deposited (block 286 of FIG. 5). The top surface of the PMD layer 284 may be smoothed by chemical mechanical polishing (block 288 of FIG. 5). Thereafter, contact openings 290 shown in FIG. 4E are formed in a two-phased contact etch step (block 292 of FIG. 5). In the first phase of the contact etch step 292, a photolithographic mask (not shown) defining the contact openings 290 is placed over the wafer, and an etch chemistry is employed that etches the silicon dioxide of the PMD layer 284 at a higher rate than the silicon nitride of the etch stop layer 272 to form the contact openings 290 down to the top of the etch stop layer 272. In the second phase of the contact etch step 292 of FIG. 5, the etched PMD layer 284 serves as a mask, and a different etch chemistry is employed that attacks the etch stop layer 272 at a much higher rate than the PMD layer, to complete the formation of the contact openings 290 through the etch stop and PMD layers 272, 284.

In the foregoing process, the low temperature process steps of contact silicide formation and etch stop deposition are performed before dynamic surface annealing, so that these low temperature process steps cannot cause dopant deactivation after dynamic surface annealing. Also, the presence of a layer (i.e., the etch stop layer 272) underneath the ACL 276 during the DSA step prevents changes in device performance that would otherwise be caused by exposure of the silicon and polycrystalline silicon surfaces to the oxygen plasma in the post-DSA ACL removal step.

FIGS. 6A-6E and FIG. 7 illustrate another embodiment of a process for preventing dopant deactivation following the DSA step. FIGS. 6A through 6E illustrate a sequence of process steps in which both the etch stop layer 272 and the PMD layer 284 are deposited prior to performance of ACL deposition and the DSA step. This provides even greater prevention of dopant deactivation by low temperature processing and greater protection of silicon surfaces during oxygen plasma ACL removal. The process sequence of FIGS. 6A through 6E will now be described with reference to the flow chart of FIG. 7.

Figure 5:
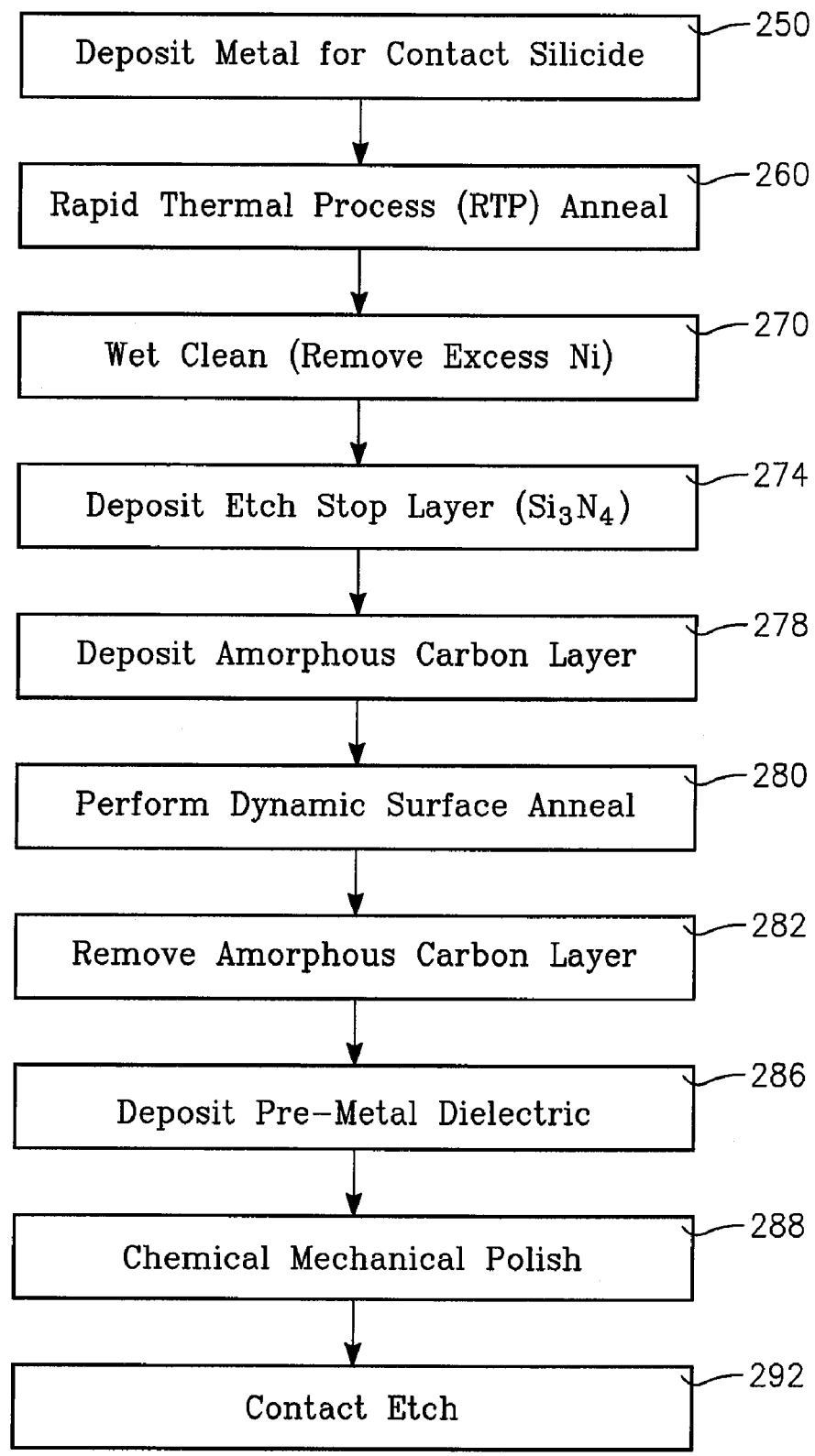
FIG. 5 is a block flow diagram of a process corresponding to FIGS. 4A through 4E.
Figure 6A:
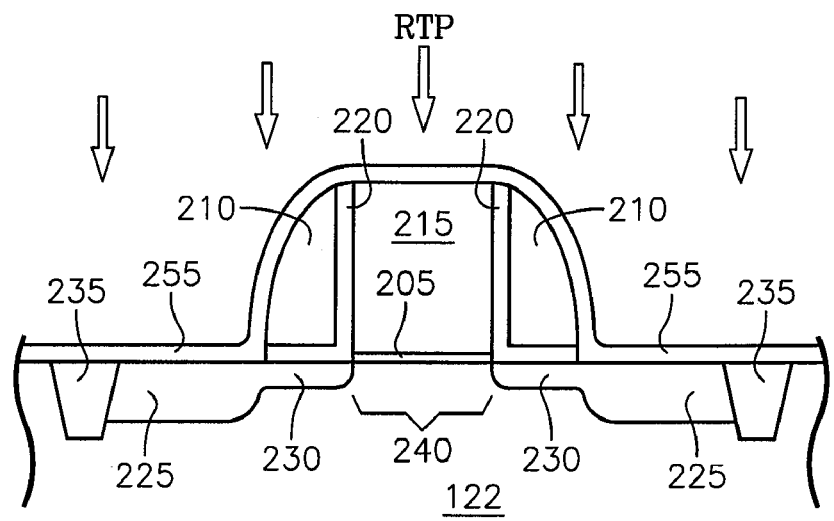
FIGS. 6A through 6E are successive images of a workpiece or wafer corresponding to steps in a process in an embodiment.
Figure 6B:
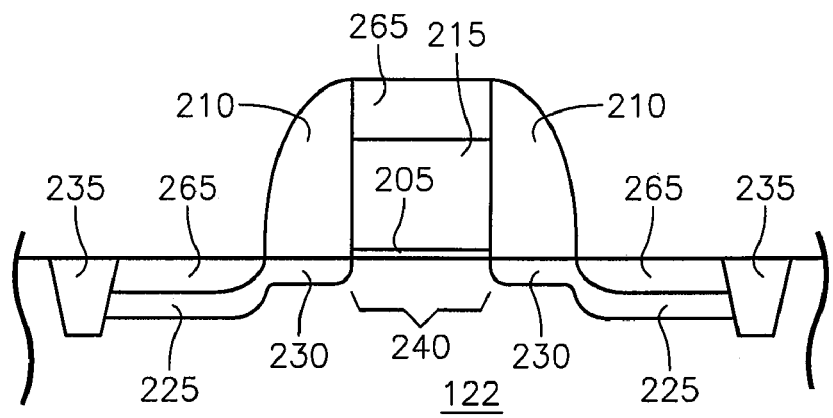
Figure 6C:
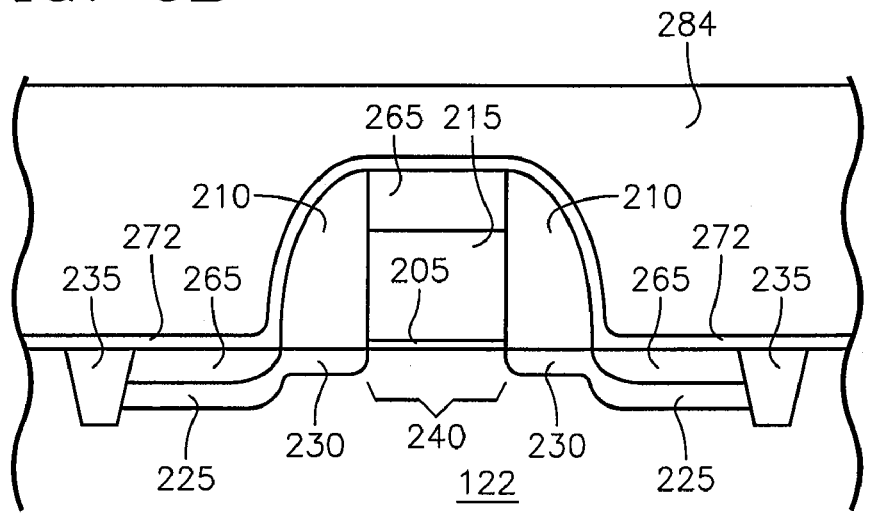
Figure 6D:
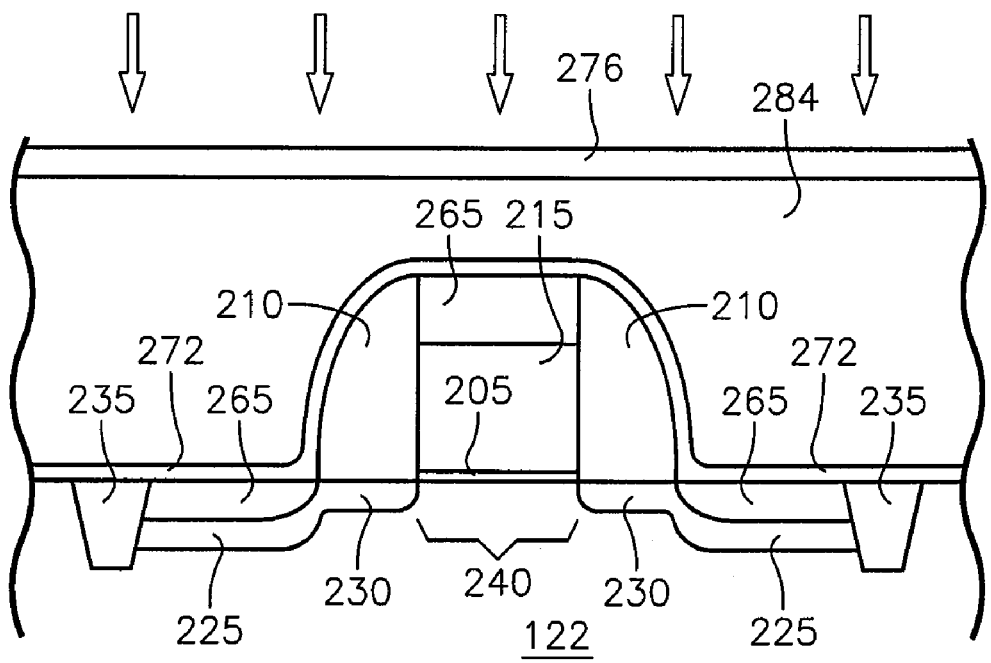
Figure 6E:
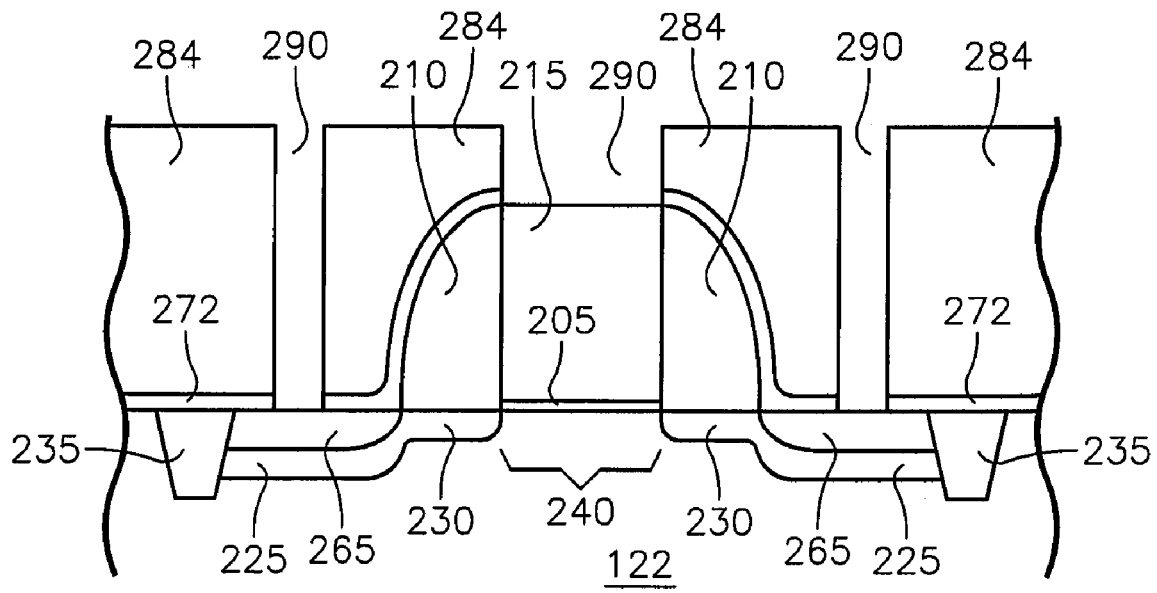

The first step (block 250 of FIG. 7) is to deposit a metal layer 255 shown in FIG. 6A over the entire substrate. The metal layer 255 may be nickel, and touches silicon material only on the surfaces of the source-drain regions 225 and on the surface of the gate 215. This metal deposition step may be carried out using a sputtered metal target in a physical vapor deposition reactor or a plasma enhanced physical vapor deposition reactor. In the next step (block 260 of FIG. 7), a rapid thermal process (RTP) step is performed to raise the temperature of the wafer 122 to about 450° C. so that some of the nickel layer 255 reacts with the silicon in the top surfaces of the source-drain regions 225 and the gate 215 to form nickel silicide contacts 265 depicted in FIG. 6B. The nickel material from the layer 255 reacts substantially only with the silicon material of the exposed source-drain regions 225 and with polycrystalline silicon material of the top surface of the gate 215. The remaining surfaces of the substrate 122 contacted by the nickel layer 255 are either silicon dioxide or silicon nitride materials, which essentially do not react with the nickel material of the layer 255. In the view of FIG. 6B, the excess nickel (i.e., the remaining portion of the layer 255 that has not been consumed to form nickel silicide) has been stripped off in a wet clean step (block 270 of FIG. 7). Then, an etch stop layer (e.g., a silicon nitride layer) 272 shown in FIG. 6C is deposited (in the step of block 300 of FIG. 7) to a thickness of, for example, about 1000 Å. A 3000 Å to 5000 Å thick pre-metal dielectric (PMD) layer 284 (e.g., of silicon dioxide material) is deposited on the etch stop layer 272 (block 302 of FIG. 7) as depicted in FIG. 6C. The top surface of the PMD layer 284 may be smoothed by chemical mechanical polishing (block 304 of FIG. 7). Thereafter, wafer is prepared for the DSA process step by depositing an optical absorber layer 276 shown in FIG. 6D directly onto the top surface of the PMD layer 284 (block 306 of FIG. 7). The optical absorber layer 276 may be an amorphous carbon layer (ACL) on the order of about 8000 Å thick. Then, the DSA step (block 308 of FIG. 7) is performed in the manner described in FIGS. 1-3, for example. Thereafter, the ACL optical absorber layer or ACL 276 is removed (block 310 of FIG. 7) in an oxygen plasma. The presence of the etch stop and PMD layers 272, 284 during this exposure to an oxygen plasma prevents oxidation of the silicon surfaces of the substrate and of the polycrystalline silicon gate 215, thereby avoiding introducing variations in device performance. After removal of the ACL 276, contact openings 290 depicted in FIG. 6E are formed in a two-phased contact etch step (block 312 of FIG. 7). This two-phase contact etch step is the same as described above for the two-phase contact etch step 292 of FIG. 5.

Figure 7:
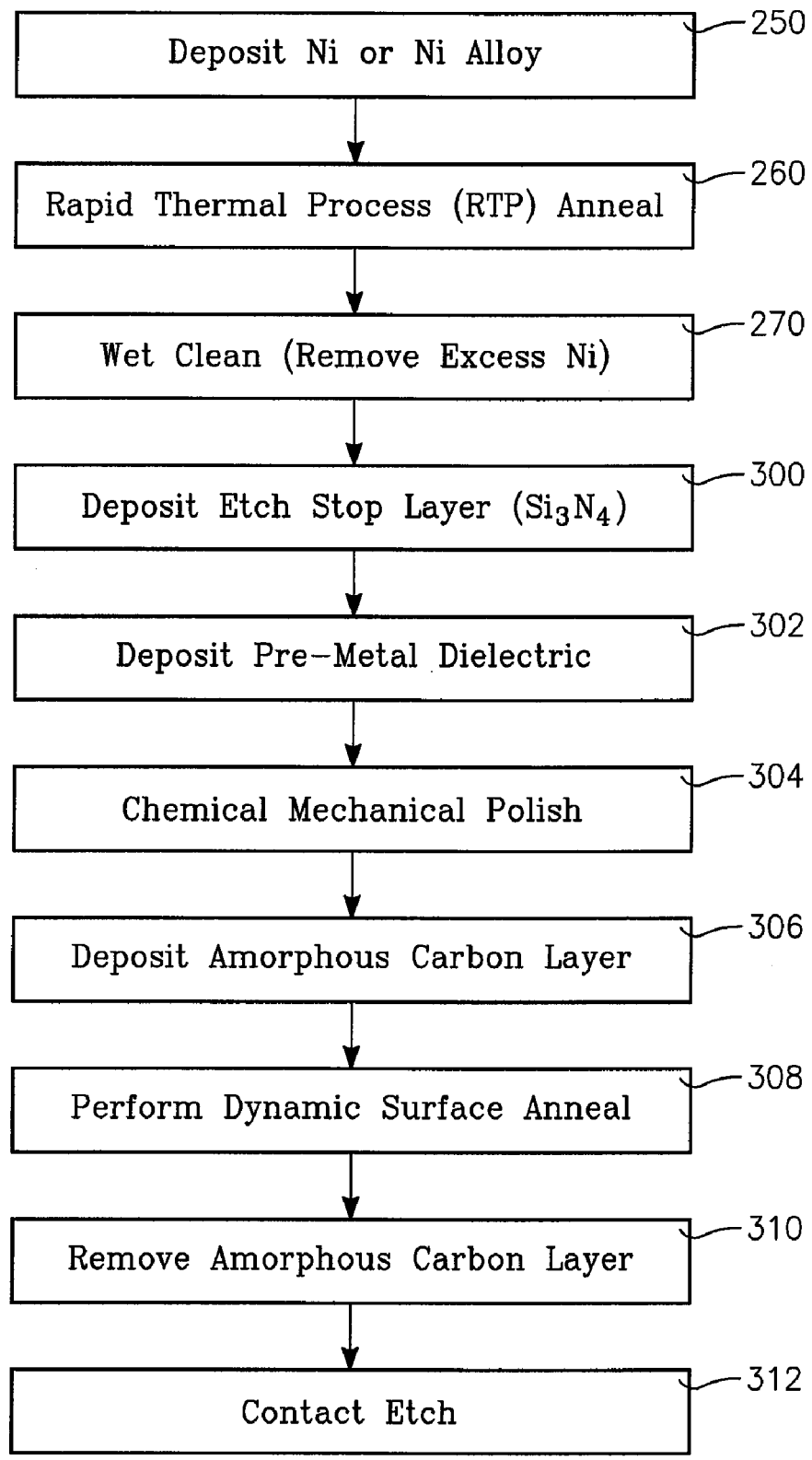
FIG. 7 is a block flow diagram of a process corresponding to FIGS. 6A through 6E.

One challenge in carrying out the processes of FIG. 5 and FIG. 7 is that the melting temperature of the nickel silicide material of the contacts 265 is about 1100° C., while the local peak temperature of the heated portion of the wafer surface during the DSA step is about 1300° C. Since the nickel silicide contacts 265 are already in place when the DSA step is performed in the processes of FIGS. 5 and 7, some melting or agglomeration of the nickel silicide material may occur during the DSA step, which may tend to increase the resistance of the contacts. Agglomeration occurs upon the nickel silicide reaching its melting temperature, causing the nickel silicide material in each contact 265 to migrate or transform from the uniform distribution across each contact 265 to a series of nickel silicide packets, so that the surface area presented by the low-resistance nickel silicide is reduced, while the surface area presented by the higher resistance silicon material within each contact increases. Such melting or agglomeration may be prevented by replacing the nickel precursor material with a metal having a higher melting temperature, such as titanium or cobalt. However, these higher temperature materials are not practical at smaller device sizes because they tend to form silicides having high resistance when confined to the small (e.g., below 45 nm) line widths. The reason for this is well-understood and has to do with the need for grain boundaries at which Co or Ti can form a low resistance silicide, the occurrence of such grain boundaries being more sparse along thinner metal lines. Nickel, although having a lower melting temperature, forms a very low resistance silicide without requiring grain boundaries and therefore is unaffected by smallness of the metal line width. Therefore, it is not practical to replace the nickel with another metal with a higher melting temperature. However, there may be a need to prevent agglomeration of the nickel silicide contacts in the processes of FIGS. 5 and 7.

Figure 8A:
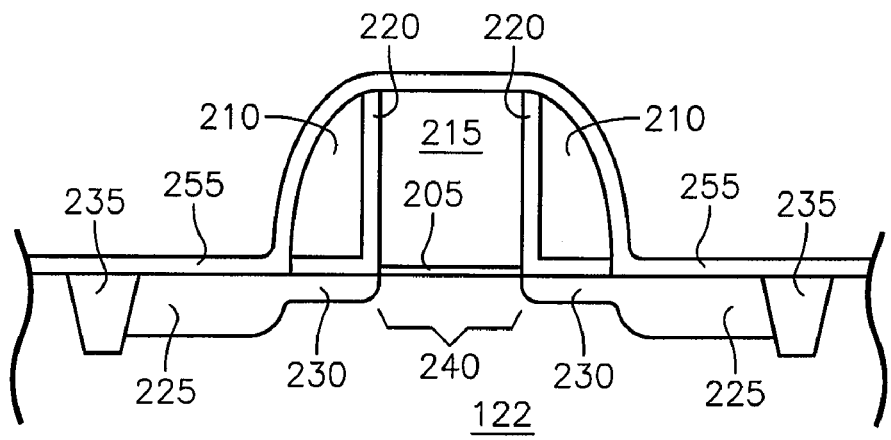
FIGS. 8A through 8C are successive images of a workpiece or wafer corresponding to steps in a process in an embodiment.
Figure 8B:
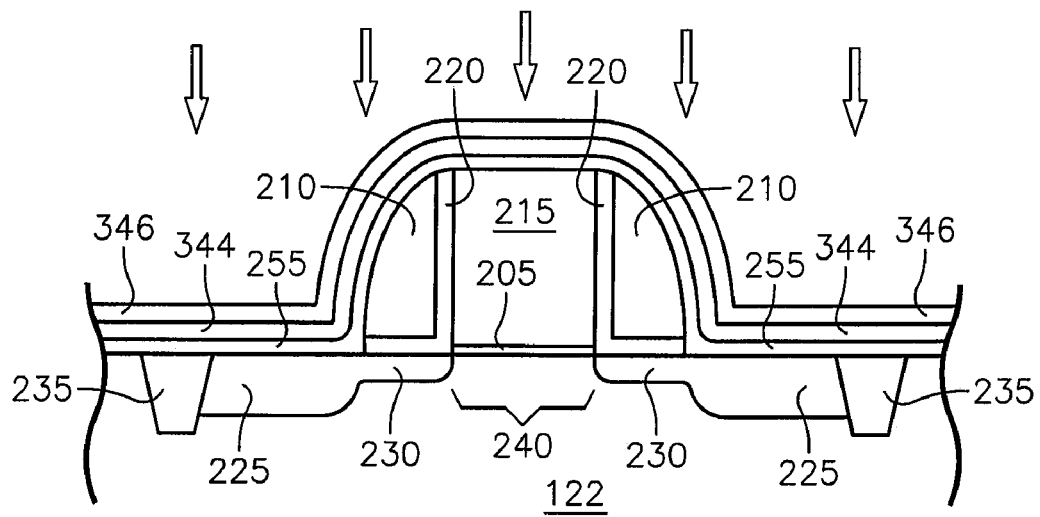
Figure 8C:
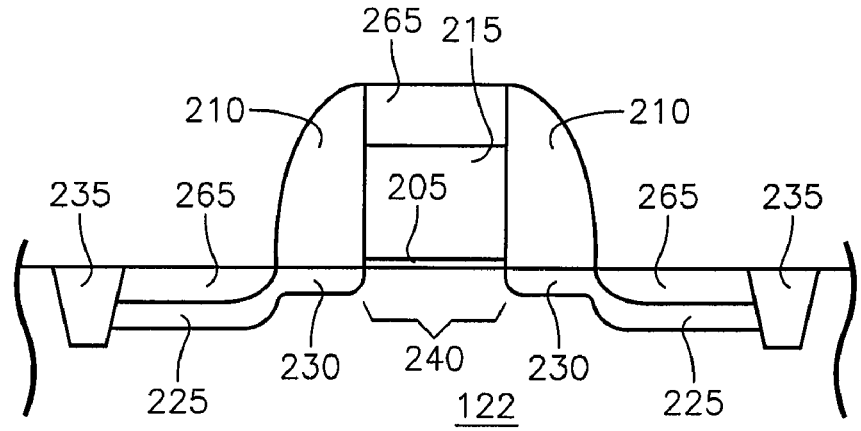
Figure 9:
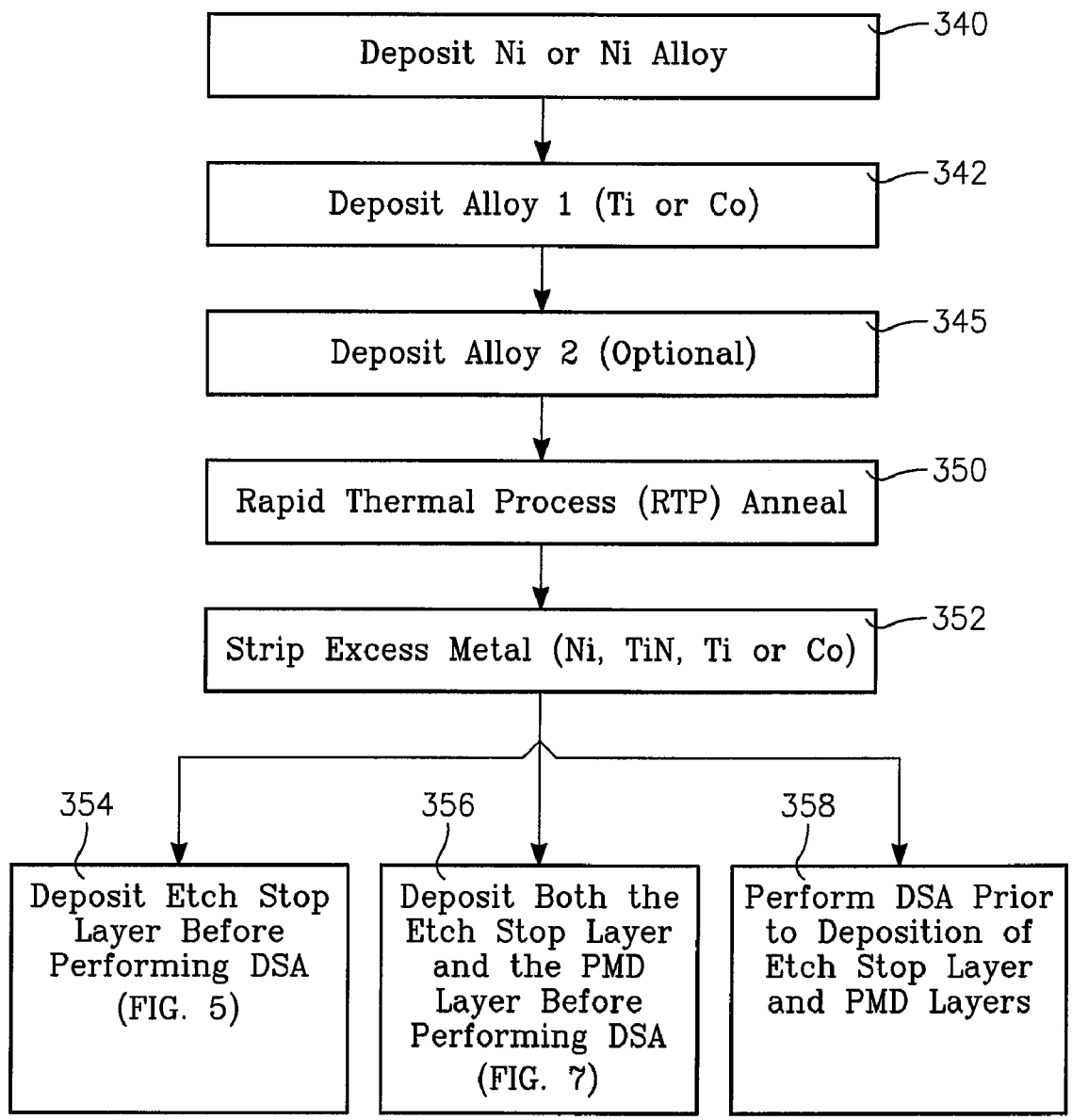
FIG. 9 is a block flow diagram of a process corresponding to FIGS. 8A through 8C.

Integrated Process with Prevention of Contact Silicide Melting During DSA Using Chemical Enhancement of the Silicide:

An integrated process that prevents melting or agglomeration of the nickel silicide contact during DSA is described with reference to FIGS. 8A through 8C and FIG. 9. This process combines a higher melting temperature metal with the nickel in forming the silicide material of the contacts. FIGS. 8A through 8C illustrate a sequence of steps in this process. FIG. 9 is a flow chart corresponding to the sequence of FIGS. 8A through 8C. The process steps of FIG. 9 can replace the process step 250 in the process of either FIG. 5 or FIG. 7. The first step (block 340) in the sequence of FIG. 9 is to deposit a nickel layer 255 on the wafer 122, as depicted in FIG. 8A. The next step (block 342 of FIG. 9) is to deposit an overlying layer 344 on the nickel layer 255, the overlying layer 344 containing a metal having a higher melting temperature than nickel, such as titanium or cobalt or titanium nitride, for example. An optional third step (block 345 of FIG. 9) is to deposit an optional third layer 346 on top of the layer 344 as depicted in FIG. 8B, the third layer 346 containing a metal that forms a higher melting temperature silicide different from the metal contained in the layer 344. The result after annealing is a silicide material that is a combination of metal silicides containing nickel (from the layer 255) and other metals (from the layers 344, 346) that tend to raise the melting temperature of the material. Each of the metal deposition steps 340, 342, 345 is carried out in a different PVD reactor or PEPVD reactor having a sputtered metal target of a particular metal corresponding to the desired layer material. For example, the sputtered target in the deposition step 340 is nickel, the sputtered target in the deposition step 342 may be cobalt and the sputtered target in the deposition step 345 may be titanium. Each of the two layers 344, 346 contains a different one of the set of higher melting temperature materials that includes titanium, cobalt, tungsten, molybdenum, hafnium, tantalum, and titanium nitride. Thus, if the layer 344 contains cobalt, then the layer 346 can contain titanium, as one example.

The next step (block 350 of FIG. 9) is to form a metal silicide material in each of the contact regions 265 by performing an RTP step to heat the wafer to a sufficiently high temperature (e.g., 450° C.) to obtain a reaction between the metal-containing layers 255, 344, 346 and the underlying silicon material of the substrate 122 and gate 215. The resulting metal silicide contact regions 265 are depicted in FIG. 8C. FIG. 8C depicts the integrated circuit after formation of the metal silicide contacts 265 and after the excess (unused) metal has been stripped from the wafer 122 in a wet clean step of block 352 of FIG. 9.

Figure 10A:
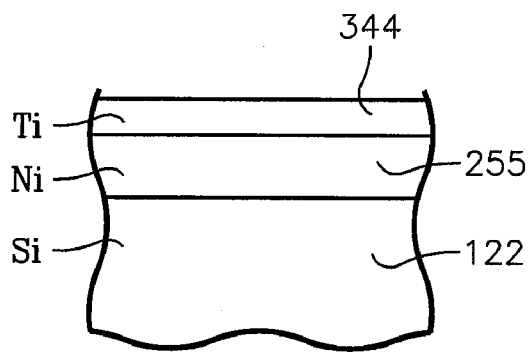
FIGS. 10A through 10D depict different silicide precursor structures in accordance with different embodiments.
Figure 10B:
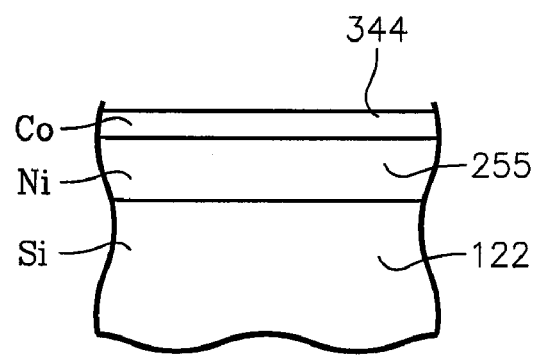
Figure 10C:
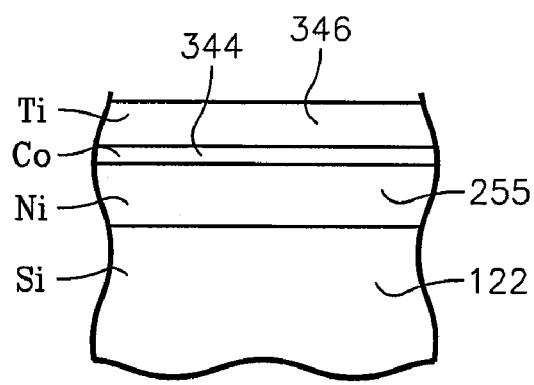
Figure 10D:
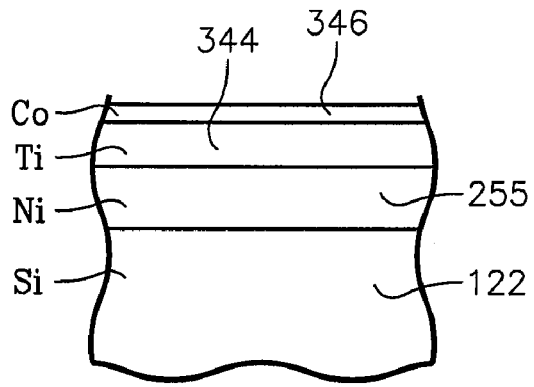

The metal silicide contacts 265 formed in the sequence of FIGS. 8A through 8C is a compound of all the metals in the nickel layer 225 and the overlying layer 344 (and the optional layer 346 if present) with silicon. For example, if the layers 344, 346 contain cobalt and titanium respectively, then the contact regions 265 consist of the compound silicide $NiTi_xCo_ySi$. Otherwise, the contact consist of the silicides $NiTi_xSi$ or $NiCo_ySi$, depending upon which of the Co and Ti layers are present. The proportions, x and y, of titanium and cobalt relative to nickel are determined at least in part by the relative thicknesses of the layers 255, 344, 346 containing the respective metals Ni, Ti, Co. Generally, the proportions of Ti and Co are small compared to the nickel content of the $NiTi_xCo_ySi$ compound silicide, so that the superior conductivity properties at small device sizes (line widths) of nickel silicide dominate the characteristics of the compound silicide $NiTi_xCo_ySi$ or $NiTi_xSi$ or $NiCo_ySi$. In one example, the nickel layer 255 was 100 Å thick, the cobalt layer 344 was 50 Å thick and the titanium layer 346 was also 50 Å thick. FIGS. 10A through 10D depict various choices for the sandwiched metal layers 255, 344, 346 that are deposited prior to the RTP step of block 350 of FIG. 9. In FIG. 10A, the nickel layer 255 is covered by a titanium layer 344 only. In FIG. 10B, the nickel layer 255 is covered by a cobalt layer 344 only. In FIG. 10C, the nickel layer 255 is covered by a lower cobalt layer 344 and an upper titanium layer 346. In FIG. 10D, the nickel layer is covered by a lower titanium layer 344 and an upper cobalt layer 346. Generally the nickel layer 255 is thicker (e.g., 100 Å) than any of the overlying layers, in order to obtain a silicide material in which the nickel silicide properties (e.g., low resistance that is unaffected by line width or device size) dominate. The upper layers 344, 346 may be on the order of 50 Å thick.

The mixture of a higher melting temperature metal (e.g., Ti and/or Co) with the Ni in the silicide compound of the contact 265 renders the contact less susceptible or more impervious to melting or agglomeration at the high temperature of the DSA process step. The proportion of the Ti and/or Co in the nickel silicide material should be sufficiently high to achieve this result but not so high as to compromise the low resistance qualities of the nickel silicide for small line widths (e.g., less than 45 nm). Generally, the proportion of Ni is twice the proportion of either Ti or Co.

Following completion of the contact formation process of FIG. 9, the wafer may be processed in accordance with the remaining steps of the process of FIG. 5 (block 354 of FIG. 9) or FIG. 7 (block 356 of FIG. 9). Alternatively, the DSA process step may be performed prior to the deposition of the etch stop layer and the pre-metal dielectric layer (block 358 of FIG. 9).

Integrated Process with Prevention of Contact Silicide Agglomeration During DSA Using a Mechanically Compressive Cap:

An integrated circuit fabrication process that prevents agglomeration of the nickel silicide contact during DSA using physical compression is described with reference to FIGS. 11A-11E and FIG. 12. FIGS. 11A through 11E depict a sequence of process steps in which a physical compression cap is employed to prevent agglomeration of the nickel silicide contact material during the DSA step. FIG. 12 is a flow chart of the process of FIGS. 11A through 11E.

Figure 11A:
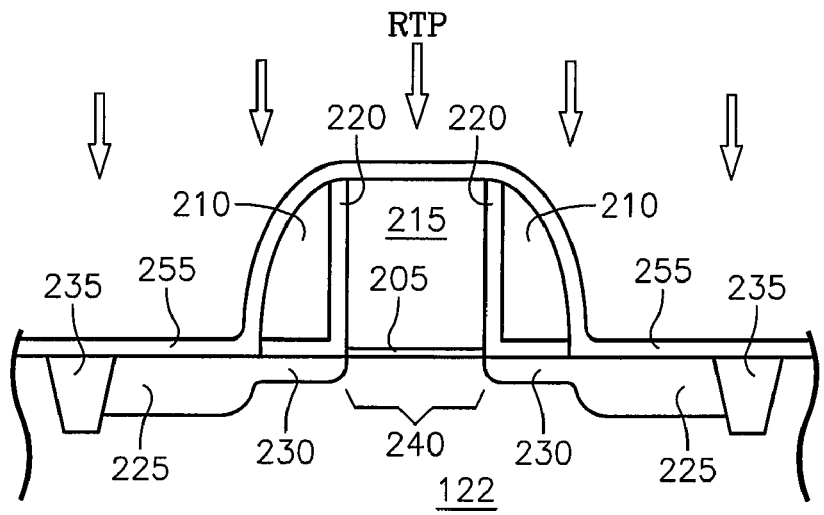
FIGS. 11A through 11E are successive images of a workpiece or wafer corresponding to steps in a process in an embodiment.
Figure 11B:
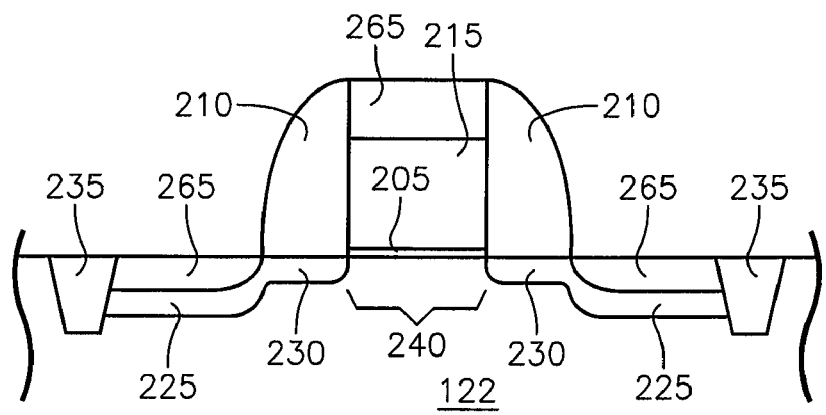
Figure 11C:
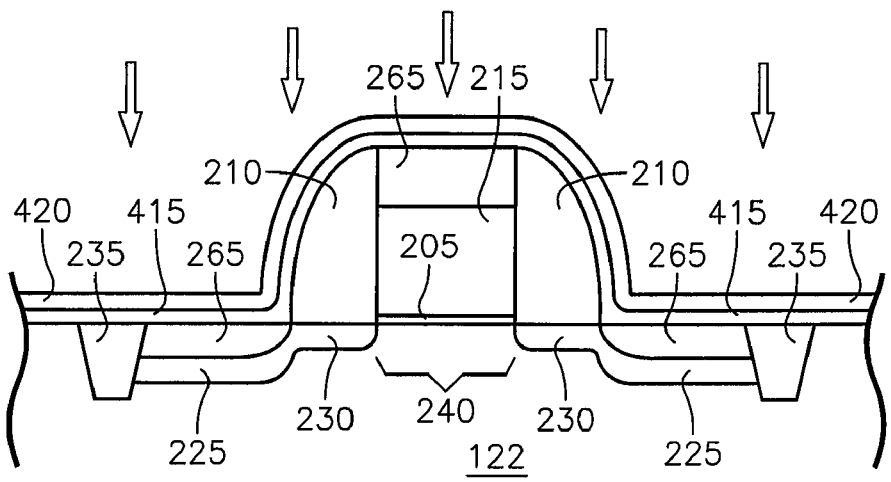
Figure 11D:
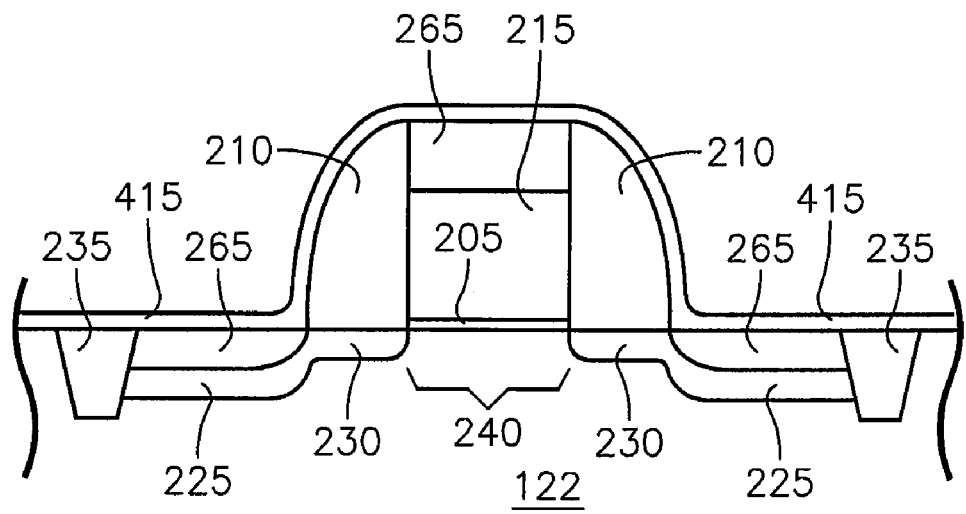
Figure 11E:
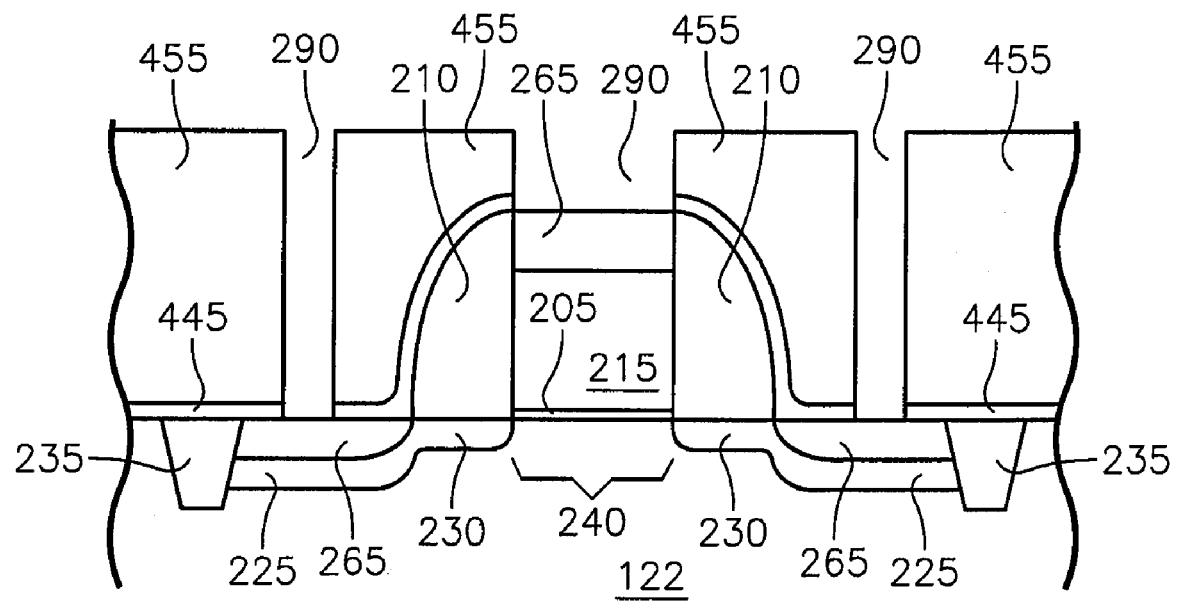
Figure 12:
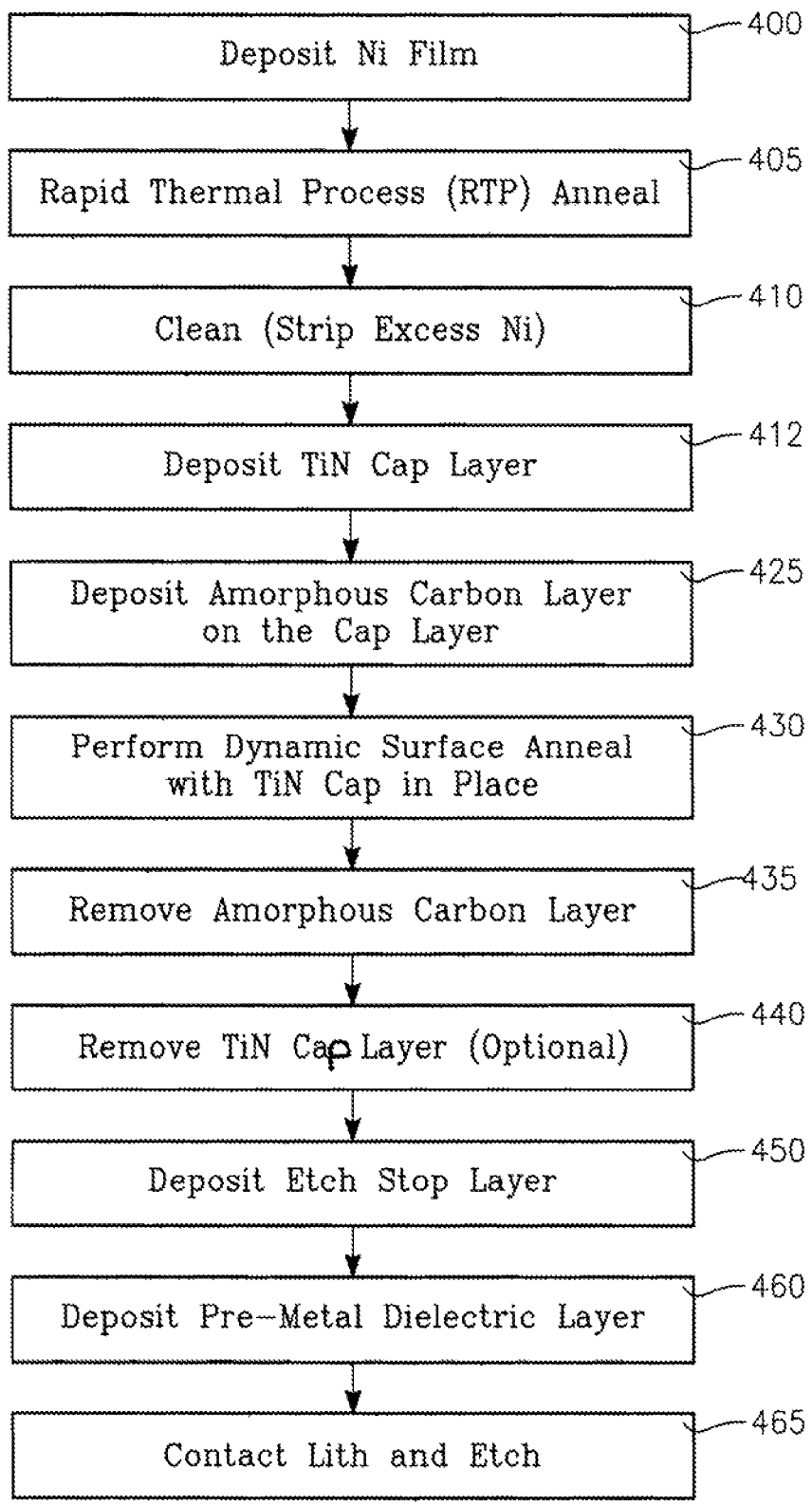
FIG. 12 is a block flow diagram of a process corresponding to FIGS. 11A through 11E.

The first step in this process (block 400 of FIG. 12) is to deposit the layer 255 of nickel, as shown in FIG. 11A. Optionally, the additional layer(s) 344 (and 346) of higher melting temperature metals may also be deposited, as described above with reference to the process step. An RTP step (block 405 of FIG. 12) is performed to obtain a reaction between the metal layer(s) 255 (and 340, 346) and the silicon material of the substrate 122 and gate 215. This forms the nickel silicide contact regions 265 depicted in FIG. 11B. FIG. 11B depicts the integrated circuit after a wet clean step (block 410 of FIG. 12) has been performed to remove excess nickel. The next step (block 412 of FIG. 12) is to deposit a compression layer 415 on the substrate 122. In one embodiment, the compression layer 415 is a titanium nitride layer. Deposition of the titanium nitride compression layer 415 may be carried out in a physical vapor deposition reactor or a plasma enhanced physical vapor deposition reactor by sputtering a titanium target in a nitrogen-containing gas. The deposition rate and deposition time are selected to achieve a sufficient thickness of the compression layer 415 (e.g., from about 3000 Å to about 8000 Å) to mechanically compress the nickel silicide contact surfaces. The compression should be sufficiently thick (e.g., from about 3000 Å to about 8000 Å) to oppose movement or agglomeration of the nickel silicide contact material during the DSA step. Following deposition of the compression cap layer 415, an optical absorber layer 420 depicted in FIG. 11C is deposited (block 425 of FIG. 12). The optical absorber layer 420 may be an amorphous carbon layer (ACL) deposited by plasma enhanced chemical vapor deposition, high density plasma chemical vapor deposition, physical vapor deposition or plasma enhanced physical vapor deposition. With the ACL 420 in place, a DSA step (block 430 of FIG. 12) is performed in accordance with the description of FIGS. 1-3. During the DSA step in which the locally heated region of the wafer surface reaches 1300° C., the compression cap layer 415 compresses the nickel silicide surfaces of the contacts 265 sufficiently to prevent migration or agglomeration of the nickel silicide material. Thereafter, the ACL 420 is removed (block 435) in an oxygen plasma, for example. The presence of the titanium nitride cap layer 415 prevents oxidation of the polycrystalline silicon gate 215 or of the silicon substrate 122 that might otherwise occur during exposure to the oxygen plasma. This prevents or minimizes the introduction of variation in device performance that such oxidation could cause. After the removal of the ACL 420, the cap layer 415 is removed (block 440 of FIG. 12) prior to the remaining integrated circuit fabrication steps. Optionally, the cap layer 415 may be left in place. Thereafter, a silicon nitride etch stop layer 445 depicted in FIG. 11E is deposited (block 450 of FIG. 12) and a pre-metal dielectric layer 455 depicted in FIG. 11E is deposited (block 460 of FIG. 12). The contact openings 290 are then photolithographically defined and etched (block 465 of FIG. 12).

In an alternative embodiment, the process of FIG. 12 is modified so that the steps of block 450 (etch stop layer deposition) and (optionally) block 460 (PMD layer deposition) are performed before the steps of block 425 (ACL deposition) and 430 (DSA) are performed. The advantages of depositing the etch stop layer and the PMD layer prior to the ACL deposition and DSA step have been described above. In this alternative embodiment, contact openings are etched in a two-phase etch process that has been previously described in this specification. Specifically, contact openings are etched through the silicon dioxide PMD layer in a first dielectric etch process in which the silicon nitride etch stop layer has a low or negligible etch rate, and then the contact openings are continued through the etch stop layer and through the compressive cap layer in a second dielectric etch process in which the etch stop layer has a substantial or high etch rate.

Another mode for imposing a mechanically compressive layer on the nickel silicide contacts 265 is to deposit the etch stop and PMD layers 272, 284 of FIG. 7 prior to performance of the DSA step. Their combined thicknesses (1000 Å and 5000 Å) are such as to impose a sufficient mechanical compression on the nickel silicide contacts 265 to prevent or minimize agglomeration during the DSA step.

While the foregoing is directed to embodiments of the invention, other and further embodiments of the invention may be devised without departing from the basic scope thereof, and the scope thereof is determined by the claims that follow.

What is claimed is:

1. A method of processing a substrate having a silicon-containing semiconductor channel and an overlying silicon-containing gate electrode separated from said channel by a thin gate dielectric layer, comprising:
    forming a pair of source-drain regions in said channel adjacent opposing edges of said gate electrode by ion implanting dopant impurities;
    depositing a metal-containing layer on top surfaces of said source-drain regions and of said gate electrode;
    depositing a compression cap layer on said metal-containing layer;
    performing a rapid thermal process step to heat said substrate sufficiently to form metal silicide contacts at the top surfaces of said source-drain regions and of said gate electrode;
    removing the remainder of said metal-containing layer; and
    scanning a focused line beam of radiation from an array of plural lasers across said substrate along a direction transverse to the focused line beam so as to create a surface temperature near the melting point of said substrate in a surface zone illuminated by the line beam.

2. The method of claim 1 wherein the step of depositing a compression cap layer comprises depositing the compression cap layer to a sufficient thickness to prevent agglomeration of metal silicide material at or near the melting temperature of said silicon.

3. The method of claim 1 wherein said metal containing layer comprises nickel.

4. The method of claim 3 wherein said rapid thermal process step heats said substrate to a temperature of about 450° C.

5. The method of claim 1 wherein said compression layer comprises silicon nitride.

6. The method of claim 1 wherein said compression cap layer is on the order of about 3000 Å to 8000 Å thick.

7. The method of claim 1 wherein depositing a metal-containing layer comprises:
    depositing a base metal layer of nickel;
    depositing on said base metal layer an overlying layer of a metal having a higher melting temperature than nickel.

8. The method of claim 7 wherein said overlying metal layer comprises one of: (a) titanium, (b) cobalt.

9. The method of claim 8 further comprising depositing on said overlying layer a second overlying layer of the other one of: (a) titanium, (b) cobalt.

10. The method of claim 1 further comprising:
    depositing an optical absorber layer over said substrate after said removing the remainder of said metal-containing layer and prior to said scanning a focused line beam of radiation from an array of plural lasers; and
    removing said optical absorber layer after said scanning a focused line beam of radiation from an array of plural lasers.

11. The method of claim 10 further comprising:
    after removing said optical absorber layer, depositing an etch stop layer on said substrate and then depositing a pre-metal dielectric layer on said etch stop layer;
    performing a first dielectric etch process so as to form respective contact openings through said pre-metal dielectric layer in registration with respective ones of said contacts, wherein said etch stop layer comprises a material having a lower etch rate than said pre-metal dielectric layer in said first etch process; and
    performing a second dielectric etch process so as to form respective contact openings through said etch stop layer and through said compression cap layer.

12. The method of claim 10 further comprising:
    after removing said optical absorber layer, removing said compression cap layer;
    depositing an etch stop layer on said substrate and then depositing a pre-metal dielectric layer on said etch stop layer;
    performing a first dielectric etch process so as to form respective contact openings through said pre-metal dielectric layer in registration with respective ones of said contacts, wherein said etch stop layer comprises a material having a lower etch rate than said pre-metal dielectric layer in said first etch process; and
    performing a second dielectric etch process so as to form respective contact openings through said etch stop layer.

13. A method of processing a substrate comprising a silicon-containing semiconductor region, comprising:
    ion implanting a dopant impurity into a selected zone of said semiconductor region;
    depositing a metal-containing layer on a top surface of said zone;
    depositing a compression cap layer on said metal-containing layer;
    performing a rapid thermal process step to heat said substrate sufficiently to form a metal silicide contact at the top surface of said zone;
    removing the remainder of said metal-containing layer; and
    scanning a focused line beam of radiation from an array of plural lasers across said substrate along a direction transverse to the focused line beam so as to create a surface temperature near the melting point of said substrate in a surface zone illuminated by the line beam.

14. The method of claim 12 wherein said depositing a compression cap layer comprises depositing the compression cap layer to a sufficient thickness to prevent agglomeration of metal silicide material at or near the melting temperature of said silicon.

15. The method of claim 12 wherein said metal containing layer comprises nickel.

16. The method of claim 14 wherein said rapid thermal process step heats said substrate to a temperature of about 450° C.

17. The method of claim 15 wherein said compression cap layer comprises silicon nitride.

18. The method of claim 17 wherein said compression layer is on the order of about 3000 Å to 8000 Å thick.

19. The method of claim 13 wherein depositing a metal-containing layer comprises:
    depositing a base metal layer of nickel;
    depositing on said base metal layer an overlying layer of a metal having a higher melting temperature than nickel.

20. The method of claim 19 wherein said overlying metal layer comprises one of: (a) titanium, (b) cobalt.

21. The method of claim 20 further comprising depositing on said overlying layer a second overlying layer of the other one of: (a) titanium, (b) cobalt.

22. The method of claim 13 further comprising:
   depositing an optical absorber layer over said substrate after said removing the remainder of said metal-containing layer and prior to said scanning a focused line beam of radiation from an array of plural lasers; and
   removing said optical absorber layer after said scanning a focused line beam of radiation from an array of plural lasers.

23. The method of claim 22 further comprising:
   after removing said optical absorber layer, depositing an etch stop layer on said substrate and then depositing a pre-metal dielectric layer on said etch stop layer;
   performing a first dielectric etch process so as to form respective contact openings through said pre-metal dielectric layer in registration with respective ones of said contacts, wherein said etch stop layer comprises a material having a lower etch rate than said pre-metal dielectric layer in said first etch process; and
   performing a second dielectric etch process so as to form respective contact openings through said etch stop layer and through said compression cap layer.

24. The method of claim 22 further comprising:
   after removing said optical absorber layer, removing said compression cap layer;
   depositing an etch stop layer on said substrate and then depositing a pre-metal dielectric layer on said etch stop layer;
   performing a first dielectric etch process so as to form respective contact openings through said pre-metal dielectric layer in registration with respective ones of said contacts, wherein said etch stop layer comprises a material having a lower etch rate than said pre-metal dielectric layer in said first etch process; and
   performing a second dielectric etch process so as to form respective contact openings through said etch stop layer.

* * * * *